United States Patent [19]

Swinehart

[11] 4,055,457
[45] Oct. 25, 1977

[54] METHOD FOR GROWING ABSORPTION-FREE ALKALI METAL HALIDE SINGLE CRYSTALS

[75] Inventor: Carl F. Swinehart, University Heights, Ohio

[73] Assignee: The Harshaw Chemical Company, Cleveland, Ohio

[21] Appl. No.: 716,051

[22] Filed: Aug. 20, 1976

Related U.S. Application Data

[63] Continuation-in-part of Ser. No. 434,364, Jan. 17, 1974, abandoned.

[51] Int. Cl.$^2$ .................. B01J 17/06; B01J 17/08; C01D 3/04; C01D 3/10
[52] U.S. Cl. .................. 156/616 R; 156/DIG. 71; 156/DIG. 66; 156/617 R; 423/499; 252/301.4 H
[58] Field of Search ......... 156/DIG. 7, 616 R, 617 R, 156/617 H, 605, DIG. 66; 423/490, 499; 252/301.4 H

[56] References Cited

U.S. PATENT DOCUMENTS

| 475,576 | 5/1892 | Lawton | 156/DIG. 71 |
| 3,837,882 | 9/1974 | Swinehart | 252/301.4 H |
| 3,840,651 | 10/1974 | Ireland | 156/DIG. 71 |
| 3,969,491 | 7/1976 | Pastor | 156/DIG. 71 |

FOREIGN PATENT DOCUMENTS

| 1,123,991 | 8/1968 | United Kingdom | 156/DIG. 71 |
| 1,137,582 | 12/1968 | United Kingdom | 156/DIG. 71 |
| 492,722 | 9/1938 | United Kingdom | 252/301.4 H |
| 940,917 | 11/1963 | United Kingdom | 252/301.4 H |

OTHER PUBLICATIONS

Butler et al., A Method for Purif. and Growth of KCl Single Crystals, ORNL-3906, Feb. 1966, pp. 1-39.

Primary Examiner—Stephen J. Emery
Attorney, Agent, or Firm—James A. Lucas

[57] ABSTRACT

Large ultra-pure, prism-quality essentially single crystal boules and ingots of alkali metal chlorides and alkali metal bromides are grown by the methods of Kyropoulos and Stockbarger. Optically single crystals of these alkali metal halides are clear optical bodies free of haze throughout. A typical Kyropoulos grown boule of KBr of this invention is also absorption-free, and has cleavage or crystallographic planes which deviate from parallel by 1° to 3° per inch. By 'absorption-free' is meant freedom of absorption at 7.2 microns ($\mu$) due to nitrate, at 9.5-11 $\mu$ due to silicate, and at between 8 and 9 $\mu$ due to sulfate, which are the most difficult to control but as the term implies the bodies are also free of infrared absorption for impurities such as $CO_3^{-2}$, $PO_4^{-3}$, $OH^-$, $BO_2^-$, $SH^-$, $CNO^-$, $HCO_3^-$, etc., which are easily avoided by use of good commercially available growth stock.

A particular process for growth for either of the foregoing methods in a silica or quartz crucible, comprises growing an ultrapure ingot of KBr from a relatively impure melt containing silicate, sulfate, nitrate and nitrite ions, and includes maintaining the sodium content of the melt during growth to less than about 20 ppm (parts per million) and the barium content less than 10 ppm, adding barium bromide to the melt if necessary, and, contacting the melt with a trace of free bromine in a covered, but not air-tight, pot.

4 Claims, 3 Drawing Figures

METHOD FOR GROWING ABSORPTION-FREE ALKALI METAL HALIDE SINGLE CRYSTALS

CROSS REFERENCE TO RELATED APPLICATION

This is a continuation-in-part application of Ser. No. 434,364 filed Jan. 17, 1974, now abandoned.

BACKGROUND OF THE INVENTION

Optical bodies must satisfy, simultaneously, exacting specifications with respect to most of their properties. These specifications include maximum optical homogeneity, high and uniform transmission throughout the range of wavelengths characteristic of the particular material, low internal scatter, and absence of internal stresses. It is difficult enough to grow small, nearly perfect crystals, but to grow large ingots of the same near-perfect quality in the ambience of a mass-production facility, demands an exceptionally compelling attention to processing techniques.

It is known that Stockbarger growth requires generally purer raw materials. Thus, for economic reasons, Kyropoulos growth is preferred for mass production of ingots of alkali metal halides and particularly of potassium bromide. Moreover, Kyropoulos growth is both easier and faster than growth in a Stockbarger furnace. Despite the less purified growth stock used in Kyropoulos growth the ingot conventionally obtained is of generally high quality, exhibiting only slight haze, and generally acceptable levels of silicate absorption at 9.5-11 $\mu$, nitrate absorption band at 7.2 $\mu$, and, sulfate absorption bands at between 8 and 9 $\mu$. When especially high quality crystals are desired, for example, crystals of KBr and KCl such as are necessary for maximum transmittance of a beam of high energy radiation, the crystals must be essentially absorption-free especially at 10.6 $\mu$ where the major silicate band and compensated sulfate bands fall. It is now possible to grow such crystals by either method.

Briefly the Stockbarger method utilizes a dual-zone furnace having separately heated, individually controlled upper and lower zones. The zones are separated by a polished diaphragm or baffle through which a crucible may be controllably lowered on an elevator mechanism. The crucible is typically cylindrical and tapers to a point to form a conical bottom. Highly purified growth stock salt in the crucible is melted in the upper zone, the temperature being less than that required to cause noticeable evaporation. The crucible is then lowered slowly into the lower zone which is maintained at a temperature below the crystallization point, but not so low that the ingot will crack. A crystal is produced in the tip of the conical bottom, and grows upward as the crucible is lowered, until the entire melt forms a macrocrystal, essentially single crystal ingot. It is well known that a certain zone-purification effect inheres to Stockbarger growth and the impurities are concentrated ahead of the growth interface away from the cone of the crucible. With conventional highly purified materials it is possible to limit haze by growth rate or time given to allow the melt to clarify, but absorption bands from melt-soluble impurities, albeit at low levels, cannot be so limited, and are usually present throughout the ingot.

The Kyropoulos method, as improved by numerous workers over the years, utilizes a large cylindrical crucible, closely fitted with resistance coils to control closely the temperature of the contents of the crucible. The crucible may be of platinum or silica, and is filled with a mass of finely divided salt which is heated until the mass melts. More growth stock salt may be added until the melt fills about three-fourths of the volume of the crucible. The temperature is then raised about 100° F above the melting point. A seed crystal (a piece of a single crystal), held in a coolable holder, is inserted into the melt at the center, and rotated slowly as the temperature of the melt is reduced until the interface between the crystal and the melt is supercooled. This causes the seed to grow.

Initially, the seed grows radially; when the diameter becomes slightly less than that of the crucible, the seed may be set in slow vertical motion, if necessary, i.e., pulled, so the crystal growth is a desirable combination of the rate of pulling and the rate of drop in melt level. A proper choice of pulling speed results in a boule or ingot of fairly regular cylindrical shape, with a height roughly equal to its diameter.

Actual operation of Kyropoulos growth furnaces is somewhat more complicated, but it is to the improvement of the basic method outlined above, that this invention is directed. More specifically, there is currently a great emphasis on production of large, near-perfect crystals of alkali metal halides particularly for use as windows for transmittance of high power laser beams without significant absorption. The commercial aspects of producing such crystals dictate that an economically purified growth stock salt be used, despite the impurities present in it. There is an especial need for an economical method for producing such windows in a Kyropoulos furnace, but no such method was known. The process of this invention and the boules possessing a unique crystalline structure, produced therewith, are directed to filling this need.

SUMMARY OF THE INVENTION

It is therefore a general object of this invention to provide a new and improved process for the growing of essentially single ultrapure crystals of alkali metal halides in either a Kyropoulos furnace or a Stockbarger furnace, or modifications thereof.

It is another general object of this invention to provide a new and improved process for growing a large boule of an alkali metal halide in a Kyropoulos furnace, which process includes plural steps, each of which steps individually contributes to an improved process, which steps together, unexpectedly results in an exceptionally effective process for growing ultrapure crystals free from absorption bands.

It has been discovered that haze in a crystal ingot can be eliminated by controlling unwanted Group I and Group II metal impurities present in trace amounts in the melt from which a boule or ingot is grown.

It has also been discovered that silicate absorption bands in an ingot grown in a siliceous crucible may be eliminated from a melt containing too low a level of Group II metal impurity, by the addition of a scavenger chosen from a divalent rare earth metal salt and an additional amount of a salt of the unwanted Group II metal.

It has also been discovered that an absorption free boule of an alkali metal halide can be Kyropoulos grown, the boule being characterized by exceptionally high transmittance to a wide range of wavelengths of radiation. The boule, preferably grown in a silica or quartz crucible, is essentially free from nitrate, nitrite, silicate and sulfate absorption bands. The boule has a crystal structure which exhibits a progressive divergence of the mosaic small angle displacements, adding up to 1° to 3° per inch, unlike a crystal grown by other methods.

It is a general object of this invention to provide a process for growing ingots of chlorides and bromides of alkali metals of Group IA, which ingots are free from silicate impurity, and are essentially haze-free.

It is a specific object of this invention to provide a process for growing an ultrapure KBr single crystal ingot or boule by either the Stockbarger of Kyropoulos methods from a growth stock salt which is not as highly purified as would otherwise be required.

It is still another specific object of the invention to provide a process for eliminating nitrate, nitrite and sulfate ions from a melt of an alkali metal bromide and/or chloride by contacting the melt with a minute amount of chlorine or bromine when the melt is predominantly chloride, and with bromine when the melt is predominantly bromide.

It is a further specific object of this invention to provide a process for growing an essentially single crystal ingot from a silicate-contaminated melt of a chloride or bromide, or a mixture thereof, of an alkali metal of Group IA of the Periodic Table, comprising confining said melt in a siliceous crucible, contacting the melt with a metal silicate-forming scavenger, reacting the scavenger with silicate impurity content of the melt, removing the silicate impurity from the ingot grown, and removing at least some of the silicate impurity from the melt by depositing a silicate or silicate containing coating on the crucible.

It is another specific object of this invention to provide a process for eliminating silicate impurity and unwanted Group II metal impurity from an ingot. When the growth stock melt is an alkali metal chloride and the unwanted Group II metal is barium or calcium, then a chloride of the unwanted metal is added as a scavenger in an amount in the range from about 5 ppm to about 10 ppm; when the melt is an alkali metal bromide then a bromide of the unwanted Group II metal is added as a scavenger in the same range specified; when the melt is a mixture of predominantly chloride, bromide of the unwanted Group II metal may be used. Alternatively, the scavenger may be a rare earth metal in melt-soluble form.

It is still another specific object of this invention to provide a Kyropoulos method of growing essentially single crystal boules successively from a melt of an alkali metal bromide or chloride or a mixture thereof contaminated with silicate, nitrate, nitrite and sulfate impurities, comprising confining the melt in a siliceous crucible, maintaining less than 20 ppm of unwanted Group IA and less than about 10 ppm of Group IIA metal in the melt, contacting the melt with a metal silicate-forming scavenger, reacting the scavenger with silicate impurity content of the melt, and, contacting the melt with bromine or chlorine when the melt is predominantly chloride, or bromine when the melt is predominantly bromide, and removing silicate impurity from the melt by depositing a silicate or silicate containing coating on the crucible, so as to grow a haze free boule free of infrared absorption bands due to silicate, nitrate, nitrite and sulfate impurities.

These and other objects, features and advantages of this process, and the ingots grown therewith, will become apparent to those skilled in the art from the following description of the preferred forms thereof and the examples set forth herein.

DETAILED DESCRIPTION OF PREFERRED EMBODIMENTS OF THE INVENTION

Figure 1:
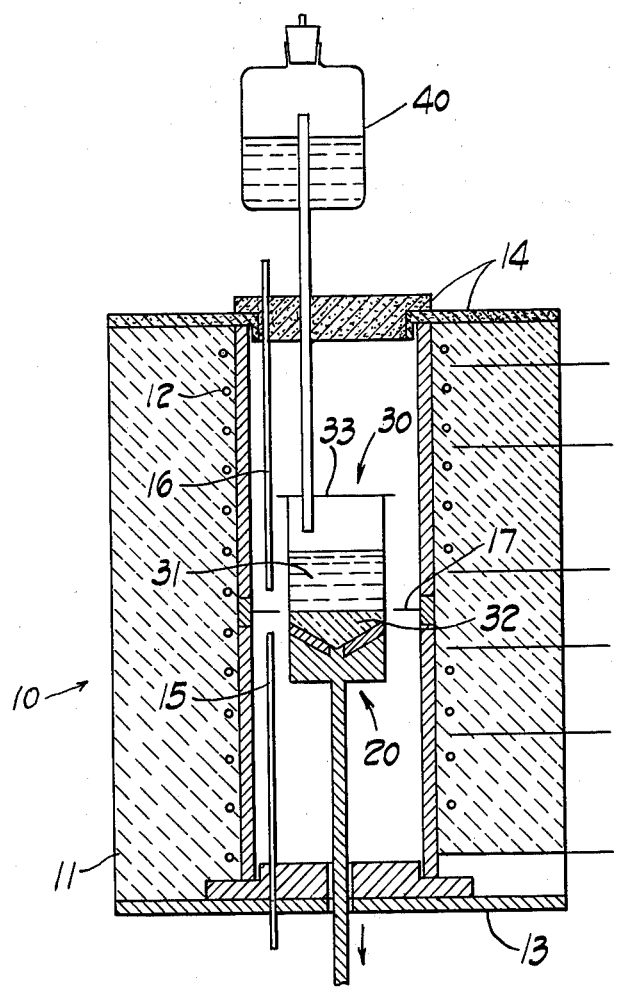
FIG. 1 is a diagrammatic illustration, in an elevation cross section view, of a typical Stockbarger furnace which is equipped with a movable means for feeding a halogen vapor above the melt.

Though conventional Stockbarger growth requires more highly purified material than Kyropoulos growth, such pure material is unnecessary in each embodiment of this invention. A typical, more highly purified, conventionally used material is represented by the following analysis on potassium bromide:

TABLE I

| Potassium bromide Suprepur ® CERTIFICATE OF GUARANTEE: | | |
|---|---|---|
| | Max. % | PPM. |
| Lead (Pb) | $2 \cdot 10^{-6}$ | 0.02 |
| Copper (Cu) | $1 \cdot 10^{-6}$ | 0.01 |
| Cobalt (Co) | $1 \cdot 10^{-6}$ | 0.01 |
| Nickel (Ni) | $1 \cdot 10^{-6}$ | 0.01 |
| Zinc (Zn) | $1 \cdot 10^{-6}$ | 0.01 |
| Iron (Fe) | $1 \cdot 10^{-6}$ | 0.01 |
| Aluminum (Al) | $1 \cdot 10^{-6}$ | 0.01 |
| Manganese (Mn) | $5 \cdot 10^{-6}$ | 0.05 |
| Thallium (Tl) | $1 \cdot 10^{-6}$ | 0.01 |
| Barium (Ba) | $5 \cdot 10^{-4}$ | 5 |
| Strontium (Sr) | $3 \cdot 10^{-4}$ | 3 |
| Calcium (Ca) | $5 \cdot 10^{-5}$ | 0.5 |
| Magnesium (Mg) | $1 \cdot 10^{-5}$ | 0.1 |
| Sodium (Na) | $5 \cdot 10^{-4}$ | 5 |

A commercially purified acceptable material, less pure than the material represented hereinabove may be used in either method of growth as described in this invention, to produce comparable or better optical properties in an ingot. A typical usable material is represented by the following analysis:

TABLE II

| | Percent |
|---|---|
| Barium (Ba) | 0.0005 |
| Bromate (BrO$_3$) | To Pass Test (Approx. 0.001) |
| Calcium, Magnesium and R$_2$O$_3$ Ppt. | 0.005 |
| Chloride (Cl) | 0.20 |
| Heavy Metals (as Pb) | 0.0005 |
| Insoluble Matter | 0.005 |
| Iodide (I) | 0.001 |
| Iron (Fe) | 0.0005 |
| Nitrogen Compounds (as N) | 0.005 |
| Sodium (Na) | 0.002 |
| Sulfate (SO$_4$) | 0.005 |

For purposes of illustration KBr has been chosen, because, though KBr, KCl and NaCl crystals have similar physical and optical characteristics, large prism-quality crystals of KBr are known to be most difficult to grow. Furthermore, nitrate absorption bands are a more serious problem in KBr than in NaCl crystals. It may be possible to grow absorption free and haze-free macro-crystals with even poorer material than that described in Table II, but the precise maximum limits of impurities is not known. It will be readily evident, however, that super-pure material is not necessary to grow absorption free crystals. By 'absorption-free' is meant freedom of absorption at 7.2 $\mu$ due to nitrate, at 9.5-11 $\mu$ due to silicate, and at between 8 and 9 $\mu$ due to sulfate, which are the most difficult to control but as the term implies, the bodies are also free of infrared absorption for impurities such as $CO_3^{-2}$, $PO_4^{-3}$, $OH^-$, $BO_2^-$, $SH^-$, $CNO^-$, $HCO_3^-$, etc., which are easily avoided by use of good commercially available growth stock.

In one embodiment, wherein a KBr ingot is grown in an alundum Stockbarger furnace, potassium bromide (as described in Table II) is used in which less than about 20 ppm of sodium and less than 10 ppm barium is present. Minor amounts of silicate, sulfate and nitrate ions are also present. The salt is loaded in a quartz crucible and several loadings may be required because of shrinkage of the salt as it melts. A platinum crucible is unsuitable. A conduit is also inserted through the cover and the tip of the conduit is placed above the surface of the melt so as to permit vapors of bromine contained in a reservoir outside the furnace, to contact the melt as it is grown into an ingot. The proper temperature gradient is established between the upper and lower zones of the furnace using recording thermocouples above and below the separating diaphragm or baffle. When conditions for crystal formation are obtained, the crucible is placed at such a level that the tip of the cone is coplanar with the diaphragm. A metal thin finger extending up from a gear rack shelf of an elevator mechanism makes contact with the tip of the crucible cone so that, with the rest of the metal crucible support being insulated from the crucible itself by a layer of alundum, heat is drawn away from the very tip of the crucible first, thus starting the crystallization at that point. After the crystal is started, the crucible is lowered at a predetermined rate to provide optimum temperatures and a desirable temperature gradient. After the crystal ingot is completely grown, it is separated from the crucible and allowed to cool gradually. It is found that the ingot grown is haze-free throughout.

In addition to freedom from haze obtained as described hereinabove, freedom from nitrate and sulfate absorption bands may also be obtained, if, in addition to maintaining less than 20 ppm sodium and 10 ppm barium in the melt, a minute trace of free bromine vapors is conducted into the silica crucible so as to contact the melt. It is found that this injection of trace quantities of the same free halogen, other than fluorine, in elemental form as is present in the halide to be grown, unexpectedly rids the ingot of a nitrate absorption band of 7.2 $\mu$ and sulfate bands between 8 and 9 $\mu$. The lower level of sodium impurity is not important, but the lower level of barium impurity may be critical depending upon the extent of silicate ion impurity present. For example, where the barium impurity is less than about 5 ppm, and the level of silicate ions is unacceptable, additional barium in the form of barium bromide may be added to maintain a level close to about 10 ppm. It is hypothesized that maintaining the level of barium impurity permits the formation of barium silicate which is extracted from the melt by the silica crucible.

Some barium impurity will generally be present in the growth stock salt because of the manner in which aqueous solutions of potassium bromide are purified. If the existing level of barium impurity is substantially greater than 10 ppm, and there is insufficient silicate impurity to combine with the barium, a fresh batch of salt is indicated.

The barium impurity present in the growth stock salt acts as a scavenger for silicate ions and is preferably added as the halide, the halogen ion being the same as that predominant in the melt. The same function may be provided by a divalent rare earth metal such as the rare earth metals europium, ytterbium and samarium which are added in an effective amount in melt-soluble form, preferably as their halides, the halogen being the same as that present in the halide being grown.

In another embodiment of this invention, a commercially purified growth stock salt of alkali metal halide is used to grow a boule by Kyropoulos growth. Unlike the Stockbarger growth of an ingot, described hereinabove, a boule is removed from the melt before the entire contents of the crucible crystallize, and successive boules may be grown by maintaining a desired level of impurities in the melt, and leaving the impurities in the melt after the grown ingot is removed. Thus, where a single small boule is grown in a large quartz or siliceous crucible, silicate impurity is removed from the ingot, but may not be deposited from the melt on to the crucible in a sufficient quantity to be easily identified.

The first step in obtaining a better quality Kyropoulos grown crystal is to maintain a sodium concentration of the melt below about 20 ppm, based on the weight of elemental sodium, and to maintain the barium concentration below about 10 ppm, also based on the weight of elemental barium. If the concentration of sodium exceeds 20 ppm, and the concentration of barium exceeds 10 ppm, a hazy boule will result. This first step of limiting the sodium and barium present as impurities in a melt from which is grown a plurality of boules, sequentially, provides an improved crystal with excellent clarity. Clarity, irrespective of the absorption bands of the crystal, is an important attribute where freedom from haze is a necessary criterion.

Where silicate absorption can be tolerated, as for example, where absorption at 10.6 $\mu$ is not of critical importance, the lower level of concentration of sodium impurity in the melt is unimportant as is the lower level of barium impurity.

In those instances where silicate absorption is critical, and silicate ion impurity is to be removed, barium, calcium, or any other Group II metal may be used as a metal silicate-forming scavenger. Where the level of barium impurity in the growth stock salt is substantially less than 10 ppm, it may be deisred to add an additional amount of barium, preferably a barium bromide, to remove the silicate impurity. Optionally, a divalent rare earth metal chosen from europium, ytterbium and samarium, may be used in melt-soluble form as a scavenger. A small amount of the rare earth metal is used, preferably as the halide corresponding to the halide being grown. The small amount used should be sufficient to scavenge the silicate impurity. Irrespective of whether a Group II metal or a divalent rare earth metal is used, the silicate formed appears to coat the silica crucible with a metal silicate layer, and is thus removed from the melt. The ingot so grown exhibits no silicate absorption band at 9.5 to 11 $\mu$. This second step of scavenging silicate impurity from the melt provides a further improvement in the quality of the crystal obtained. Thus, a Kyropoulos grown ingot in which the level of sodium and barium impurities are maintained at less than 20 ppm and 10 ppm respectively in a melt used for successively growing Kyropoulos boules of potassium bromide, and, if necessary, adding a sufficient amount of scavenger to remove silicate in a second step, yields a boule which is free from haze and also free of a silicate absorption band. Excess scavenger, more than that necessary for reaction with silicate impurity in the melt, reacts slowly with the quartz crucible which continuously removes the excess by reaction therewith. The quartz crucible thus has a limited useful life.

An ingot grown as described hereinabove is still contaminated with nitrate and nitrite impurities which are evidenced by absorption bands in the 7.2 $\mu$ and 7.9 $\mu$ regions respectively. Nitrite impurities are generally present only when the nitrate impurities are at a relatively high level. Both impurities are conveniently removed by the simple expedient of contacting the melt with free or elemental chlorine or bromine. A small amount of halogen suffices. For example, free bromine vapors in trace amounts, are introduced above the surface of the melt when a predominantly alkali metal bromide ingot is grown; free chlorine or bromine vapors in trace amounts, are introduced above the surface of the melt when a predominantly alkali metal chloride ingot is grown. Where a KBr ingot is grown, and only trace quantities of bromine vapors contact the melt, a brown coloration results in the melt because of diffusion of bromine vapors. A potassium chloride melt acquires a greenish coloration due to diffusion of chlorine vapors. The coloration is not invested in the ingot as it grows, and no trace of free halogen is found in the crystal removed. Also the action for removing nitrate proceeds at such low concentrations of free halogen that visible coloration of the melt is not a prerequisite for success.

Referring now more particularly to FIG. 1 for a description of the improved process for Stockbarger growth, there is shown a Stockbarger furnace indicated generally at 10, a vertically movable platform indicated generally at 20, disposed within the furnace, a crucible indicated generally at 30, in which the optically single crystal ingot is to be grown, and a halogen reservoir indicated generally at 40 from which a compatible halogen is flowed into contact with melt 31 contained in the crucible 30. Typically, the furnace includes fire brick walls 11 in which electrical resistance windings 12 are embedded near the interior surface of the fire brick wall. The fire brick wall rests on a metal base 13 and a suitable cover 14 is provided. Thermocouples 15 and 16 are provided in the upper and lower zones of the furnace defined by a centrally disposed radiation baffle 17.

The platform 20 is vertically movable by means of a elevator mechanism (not shown). The platform is adapted to hold the crucible 30 which is provided with a conical bottom and is supported on the platform 20 by means of an alundum layer 21 therebetween. Finely divided salt to be grown into a crystal is melted at the appropriate temperature and growth of the crystal begins in the conical portion of the crucible as indicated at 32. The crucible is conventionally provided with a lid 33.

Figure 3:
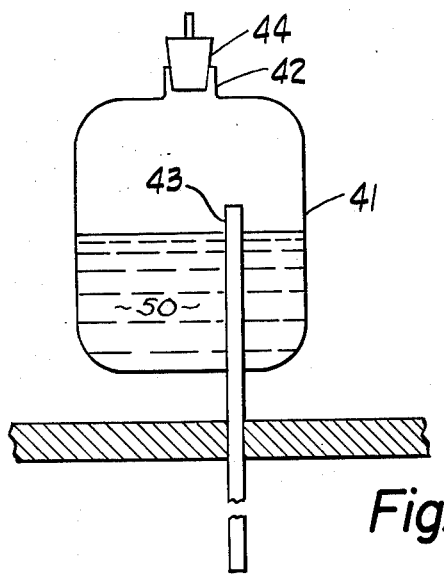
FIG. 3 is a detail of a typical reservoir for vapor-feeding a halogen to a crucible and contacting a melt with the halogen.

The halogen reservoir 40 is shown in more detail in FIG. 3. It includes a vessel 41 provided with an opening 42 through which halogen 50 is introduced into the reservoir. A tube 43 rises above the level of the halogen in the vessel and serves to conduct halogen vapors from the reservoir. The tube 43 is inserted through the cover of the furnace and is thereafter conducted through the lid of the crucible so as to permit halogen vapors to contact the melt 31. A vented stopper 44 is provided for the opening 42 of the reservoir.

In operation, sufficient heat is provided to the reservoir to vaporize halogen contained therewithin and the halogen vapors are conducted to the surface of the melt 31. The vapors are absorbed within the melt and are distributed therewithin. When potassium bromide is to be grown, the melt is contained within a quartz crucible and bromine is introduced into the melt. The amount of bromine vapors introduced in the melt is not critical and it will be apparent that only a very small amount is sufficient. The precise amount that will serve to provide an improved optically single crystal ingot is not known, but only trace amounts in the order of less than about one part per million appears to be sufficient, the important point being that the melt is treated with a trace amount of free bromine over a long period of time, preferably over the entire period of growth.

The diagrammatic illustration of the Stockbarger furnace described hereinabove is conventional except for the additional reservoir means used to introduce the halogen vapor. The inclusion of other substances within the melt of the crucible, such as for example, scavengers, is preferably done prior to initiation of growth of crystal. Typically, a scavenger is introduced before the contents of the crucible are entirely melted so as to ensure a relatively homogeneous distribution of scavenger within the melt. Growth of the Stockbarger ingot is initiated in a conventional manner and an optically single crystal ingot obtained by continued growth of the ingot in the usual way. It is found that a prism-quality optically single crystal ingot may be obtained with relatively impure growth material, for example, such as that described in Table II set forth hereinabove. Since the Stockbarger crucible is gradually lowered as crystal growth progresses, the reservoir 40 is movably disposed so as to permit the halogen vapor to be continuously fed to the surface of the melt.

Figure 2:
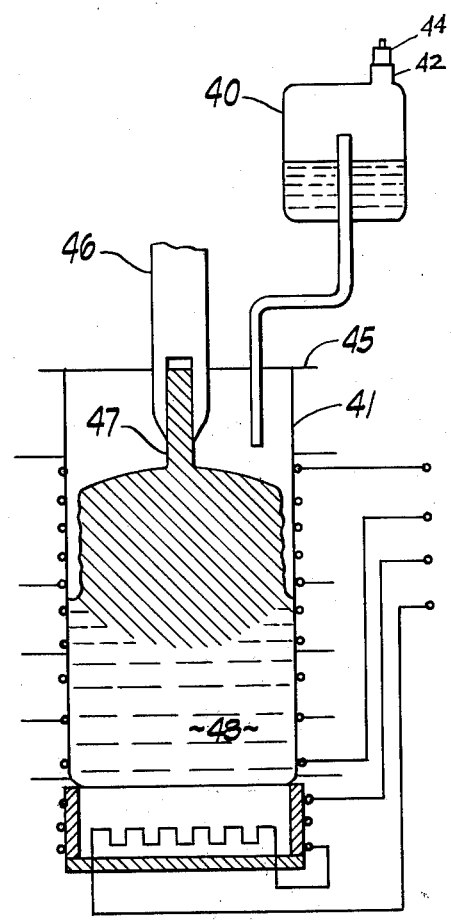
FIG. 2 is a diagrammatical illustration, in an elevation cross section view, of a typical Kyropoulos furnace equipped with means for feeding a halogen vapor above the melt.

Referring now to FIG. 2, there is diagrammatically illustrated a typical Kyropoulos furnace including a crucible 41 exteriorly provided with electrical resistance windings 42 which serve to melt finely divided salt to be grown as a boule. Scavengers and the like are added to the salt prior to or during formation of the melt 48. The crucible is typically a silica crucible and it may be provided with a base heater indicated generally at 44. The crucible is provided with a cover 45 through which a coolable holder 46 is inserted. A seed crystal 47 is fixedly disposed in the end of the holder 46.

As in the Stockbarger furnace described hereinbefore, a halogen reservoir indicated generally at 40, is provided to feed halogen vapor into the Kyropoulos growth crucible. The halogen reservoir is illustrated in FIG. 3 and described in detail hereinbefore. In operation it provides a flow of halogen vapor to the surface of the melt. Again, the amount of vapor introduced is not critical but it will be apparent that very small amounts suffice. What is important is that the small amount of halogen be flowed to the melt over a long period of time, preferably during the entire growth period of the boule. It is assumed that less than one part per million distributed within the melt serves to provide an ultra-high prism-quality boule despite the fact that growth material from which the boule is formed may be a relatively impure and commercially purified salt.

Where a boule is grown by Kyropoulos growth, in a silica or quartz crucible, by controlling unwanted Group I and Group II metal impurities present in trace amounts of the melt, and by contacting the melt with halogen vapor, as described hereinabove, the boule is essentially free from nitrate, nitrite, silicate and sulfate absorption bands. Optically single crystals obtained by the improved Kyropoulos growth of this invention are unlike Stockbarger grown ingots. Mosaics within Stockbarger ingot components have compensating plus and minus shifts in angle so the cleavage and crystal planes never deviate far from parallel. Typically, the Kyropoulos boule grown under gravity of 0.7 or more has a crystal structure which exhibits a progressive divergence of the mosaic small angle displacements, adding up to 1° to 3° per inch, unlike a crystal grown by other methods. This mosaic arrangement can be made visible by etching or by cleaving the body. Vapor etch that occurs at 600° C is particularly good for indicating the type of material in question. One can map the shape of mosaic regions and find the crystal direction by the angle of reflection. No conventionally grown Kyropoulos growth crystal exhibiting such mosaic small angle displacements are presently known which are free from the aforementioned absorption bands.

Though specific reference is made hereinabove to the growth of ingots of alkali metal chlorides and ingots of alkali metal bromides, it may be desirable to grow an ingot of mixed alkali metal chloride and bromide. For example, if may be desired to grow an ingot of potassium chloride doped with potassium bromide present in an amount less than 10 mole percent. In such an instance, where the level of barium impurity in the growth stock is less than 10 ppm, addition of barium chloride as a scavenger will remove silicate impurity. A haze-free potassium chloride ingot doped with potassium bromide may be grown by contacting the melt of mixed potassium chloride and bromide with bromine is effective to grow a haze-free ingot due to sulfate, nitrate and nitrite ions irrespective of whether the ingot grown is a pure alkali metal bromide, a pure chloride or a mixture of the two. Chlorine is effective to grow a haze-free ingot free of absorption bands due to sulfate, nitrite and nitrite ions, when the ingot grown is a pure alkali metal chloride, or a mixture of alkali metal chloride and bromide. However, chlorine is not desirable in a metal of a pure alkali metal bromide or of a melt having the bromide as a major component, because chlorine tends to displace bromine.

The methods of this invention are specifically directed to alkali metal chlorides and bromides because alkali metal fluorides do not lend themselves to growth in a quartz or siliceous crucible, and alkali metal iodide ingots are used in applications where the level of impurities contained in them are not significant.

Modifications, changes and improvements to the preferred forms of the invention herein disclosed, described and exemplified, may occur to those skilled in the art who come to understand the principals and precepts thereof. Accordingly, the scope of the patent to be issued herein should not be limited to the particular embodiments of the invention set forth herein, but rather should be limited by the advance of which the invention has promoted the art.

I claim:

1. In a Stockbarger or Kyropoulos method of growing an essentially single crystal ingot from a melt consisting of a bromide, chloride or mixture thereof, of an alkali metal of Group 1A of the Periodic Table, said melt contaminated with a silicate impurity, the improvement comprising confining said melt in a siliceous crucible, contacting said melt with a metal silicate-forming scavenger selected from the group consisting of (a) a bromide of a Group IIA metal when said melt is predominantly a bromide, (b) a chloride of a Group IIA metal when said melt is predominantly a chloride, and (c) a rare earth metal selected from europium, ytterbium and samarium added to said melt in melt-soluble form, reacting said scavenger with the silicate impurity in said melt, and removing the silicate impurity by depositing the same as a coating on the crucible to produce an ingot free of infrared absorption due to silicate impurity.

2. The method of claim 1 wherein said melt is selected from the group consisting of potassium chloride, potassium bromide and mixtures thereof.

3. The method of claim 1 wherein said Group IIA metal is selected from the group consisting of barium and calcium.

4. In a Kyropoulos method of growing essentially single crystal boules successively from a melt contaminated with silicate, nitrate, nitrite and sulfate impurities, said melt consisting of a bromide, chloride or mixtures thereof of an alkali metal of Group IA of the Periodic Table, the improvement comprising confining said melt in a siliceous crucible, maintaining less than about 20 ppm of unwanted Group IA and less than about 10 ppm of Group IIA metal in said melt, contacting said melt with a metal silicate-forming scavenger selected from the group consisting of (a) a bromide of a Group IIA metal when said melt is predominantly a bromide, (b) a chloride of a Group IIA metal when said melt is predominantly a chloride, and (c) a rare earth metal selected from europium, ytterbium and samarium added to said melt in melt-soluble form, reacting said scavenger with the silicate impurity content in said melt, removing silicate impurity from said melt by depositing a silicate containing coating on said crucible, and, contacting said melt with bromine or chlorine in elemental form, so as to grow a haze-free ingot free of infrared absorption bands due to silicate, nitrate, nitrite and sulfate impurities.

* * * * *